United States Patent
Sugioka (10) Patent No.: US 8,373,413 B2
(45) Date of Patent: Feb. 12, 2013

(54) MAGNETIC SENSING METHOD, ATOMIC MAGNETOMETER AND MAGNETIC RESONANCE IMAGING APPARATUS

(75) Inventor: Hideyuki Sugioka, Ebina (JP)

(73) Assignee: Canon Kabushiki Kaisha, Tokyo (JP)

( * ) Notice: Subject to any disclaimer, the term of this patent is extended or adjusted under 35 U.S.C. 154(b) by 627 days.

(21) Appl. No.: 12/602,670

(22) PCT Filed: May 30, 2008

(86) PCT No.: PCT/JP2008/060401
§ 371 (c)(1),
(2), (4) Date: Dec. 2, 2009

(87) PCT Pub. No.: WO2008/149957
PCT Pub. Date: Dec. 11, 2008

(65) Prior Publication Data
US 2010/0156419 A1    Jun. 24, 2010

(30) Foreign Application Priority Data

Jun. 5, 2007    (JP) .................................. 2007-149156

(51) Int. Cl.
*G01V 3/00* (2006.01)
(52) U.S. Cl. ........................................ 324/304; 324/305
(58) Field of Classification Search .................. 324/304, 324/305, 301, 300
See application file for complete search history.

(56) References Cited

U.S. PATENT DOCUMENTS

| | | | |
|---|---|---|---|
| 6,472,869 B1 | 10/2002 | Upschulte et al. | 324/304 |
| 7,038,450 B2 * | 5/2006 | Romalis et al. | 324/304 |
| 7,061,237 B2 | 6/2006 | Pines et al. | 324/304 |
| 7,652,473 B2 * | 1/2010 | Kawabata | 324/304 |
| 8,054,074 B2 * | 11/2011 | Ichihara et al. | 324/304 |
| 8,212,556 B1 * | 7/2012 | Schwindt et al. | 324/304 |
| 2004/0140799 A1 | 7/2004 | Romalis et al. | 324/301 |
| 2007/0205767 A1 | 9/2007 | Xu et al. | 324/304 |
| 2008/0106261 A1 | 5/2008 | Romalis et al. | 324/304 |

FOREIGN PATENT DOCUMENTS

| | | |
|---|---|---|
| WO | WO 2006/023208 A2 | 3/2006 |
| WO | WO 2008/008447 A2 | 1/2008 |

OTHER PUBLICATIONS

Savukov, I.M., et al., "Detection of NMR signals with a radio-frequency atomic magnetometer," Journal of Magnetic Resonance, vol. 185, 2007, pp. 214-220.

Lee, S.K., et al., "Subfemtotesla radio-frequency atomic magnetometer for detection of nuclear quadrupole resonance," Applied Physics Letters, vol. 89, 2006, pp. 214106.

Kim, K., et al., "Atomic Vector Gradiometer System Using Cesium Vapor Cells for Magnetocardiography: Perspective on Practical Application," IEEE Transactions on Instrumentation and Measurement, vol. 56, No. 2, Apr. 2007, pp. 458-462.

(Continued)

*Primary Examiner* — Louis Arana
(74) *Attorney, Agent, or Firm* — Fitzpatrick, Cella, Harper & Scinto (57) ABSTRACT

A magnetic sensing method comprises irradiating a pump light having a circularly polarized component and a probe light having a linearly polarized component onto a group of atoms contained in a cell so as to make the lights produce an intersection region and detecting a change of rotation angle of a plane of polarization of the probe light before and after passing the cell. The pump light and the probe light are irradiated in a state where a magnetic field of the direction in which the pump light strikes the intersection region is provided with a gradient.

17 Claims, 5 Drawing Sheets

OTHER PUBLICATIONS

Schwindt, P.D.D., et al., "Microfabricated Atomic Magnetometers," Sensors 2005, IEEE, Oct. 2005, pp. 73-76.

Baranga, A.B., et al., "An atomic magnetometer for brain activity imaging," 14th IEEE-NPS, Stockholm, Sweden, IEEE, Jun. 2005, pp. 417-418.

Groeger, S., et al., "Laser-pumped cesium magnetometers for high-resolution medical and fundamental research," Sensors and Actuators A, vol. 129, 2006, pp. 1-5.

Savukov, I.M., et al., "Optical detection of liquid-state NMR," Nature, vol. 442, Aug. 2006, pp. 1021-1024.

Savukov, I.M., et al., "Effects of spin-exchange collisions in a high-density alkali-metal vapor in low magnetic fields," Physical Review A, vol. 71, Feb. 2005, pp. 023405.

Kominis, I.K., et al., "A subfemtotesla multichannel atomic magnetometer," Nature, vol. 422, Apr. 10, 2003, pp. 596-599.

Savukov, I.M., et al., "NMR Detection with an Atomic Magnetometer," Physical Review Letters, vol. 94, Mar. 2005, pp. 123001.

Savukov, I.M., et al., "Tunable Atomic Magnetometer for Detection of Radio-Frequency Magnetic Fields," Physical Review Letters, vol. 95, Aug. 2005, pp. 063004.

Zibrov, S.A., et al., "Magneto-Optical Resonance in Counterpropagating Waves", Quantum Electronics and Laser Science Conference 2007, IEEE, May 2007, pp. 1-2.

Blümich, B., et al., "Mobile single-sided NMR," Progress in Nuclear Magnetic Resonance Spectroscopy, vol. 52, 2008, pp. 197-269.

* cited by examiner

PRIOR ART SENSOR

FIG. 2B

INVENTIVE SENSOR

MAGNETIC SENSING METHOD, ATOMIC MAGNETOMETER AND MAGNETIC RESONANCE IMAGING APPARATUS

TECHNICAL FIELD

This invention relates to a magnetic sensing method, an atomic magnetometer and a magnetic resonance imaging apparatus.

BACKGROUND ART

Atomic magnetometers utilizing the spin of alkali metal vapor have been proposed. U.S. Pat. No. 7,038,450 proposes a high sensitivity atomic magnetometer having a light source for circularly polarized light and a light source for probe light. Phys. Rev. Lett. 94, 123001 (2005) describes an atomic magnetometer for detecting nuclear magnetic resonance (NMR) signals and RF signals by utilizing a resonance phenomenon. U.S. Pat. No. 7,061,237 proposes a magnetic resonance imaging (MRI) apparatus using a remote detection technique and a single optical path type atomic magnetometer.

DISCLOSURE OF THE INVENTION

While resonance type atomic magnetometers utilizing a resonance phenomenon can obtain a large change of Faraday angle relative to a change in magnetic signal, they are accompanied by the problem that the measurement band is as narrow as the bandwidth of resonance.

Particularly, the measurement band that corresponds to optimal sensitivity is about 1 kHz, which is extremely narrow if compared with the measurement band (32 kHz) of an ordinary magnetic resonance imaging (MRI) apparatus using a so-called $B_0$ magnetic field of about 1.5 T.

A magnetic sensor having a narrow measurement frequency band and hence a narrow frequency band that can be used for frequency encoding conceivably cannot provide a good image quality because of image disturbances due to chemical shift artifacts. Such chemical shift artifacts are believed to be attributable to the difference of frequency shift of protons in water and those in aliphatics.

Therefore, an object of the present invention is to provide a magnetic sensing method that can broaden the measurement frequency band than in the past, an atomic magnetometer adapted to such magnetic sensing, and a magnetic resonance imaging apparatus.

In the first aspect of the present invention, there is provided a magnetic sensing method comprising:

irradiating a pump light having a circularly polarized component and a probe light having a linearly polarized component onto a group of atoms contained in a cell so as to make the lights produce an intersection region; and detecting a change of rotation angle of a plane of polarization of the probe light before and after passing the cell, wherein:

the pump light and the probe light are irradiated in a state where a magnetic field of the direction in which the pump light strikes the intersection region is provided with a gradient to acquire information relating to the change of rotation angle of the plane of polarization of the probe light before and after passing the cell.

In the second aspect of the present invention, there is provided a magnetic resonance imaging apparatus comprising:

an atomic magnetometer for operating with the above magnetic sensing method;

a gradient magnetic field generating coil for providing the intersection region with a gradient magnetic field different from the magnetic field of the detection in which the pump light strikes the intersection region to be provided with a gradient;

a magnetostatic field generating coil; and an RF coil for irradiating an electromagnetic wave onto an object of inspection.

In the third aspect of the present invention, there is provided an atomic magnetometer having:

a cell;

a group of atoms contained in the cell;

a light source for outputting a pump light having a circularly polarized component; and a light source for outputting a probe light having a linearly polarized component, the atomic magnetometer further comprising a magnetic field application unit for applying a magnetic field gradient having a magnetic field intensity difference of not less than $4h(R_{SD}+R)/(g\mu)$ to an intersection region of the pump light and the probe light, where h is the Planck's constant;

g is a g-factor;

R is a pumping rate;

$R_{SD}$ is a spin decay rate; and $\mu$ is the Bohr magneton.

In the fourth aspect of the present invention, there is provided a magnetic resonance imaging apparatus comprising the above atomic magnetometer as receiving sensor.

In still another aspect of the present invention, there is provided an atomic magnetometer comprising a light source for a circularly polarized light, a light source for a probe light and an alkali metal vapor, the apparatus further comprising a sealed cell containing alkali metal vapor and a unit for applying a magnetic field gradient to the cell, the unit applies a magnetic field gradient of not less than $4h(R_{SD}+R)/(g\mu)$ over an intersection volume of the circularly polarized light and the probe light, where h is the Planck's constant;

g is a g-factor;

R is a pumping rate;

$R_{SD}$ is a spin decay rate; and $\mu$ is the Bohr magneton.

Thus, the present invention spatially changes a bias magnetic field intensity applied to an atomic magnetometer and utilizes the phenomenon that the central resonance frequency of the atomic magnetometer is changed by the bias magnetic field. The measurement band of an atomic magnetometer can be broadened by utilizing the phenomenon.

Further features of the present invention will become apparent from the following description of exemplary embodiments with reference to the attached drawings.

BEST MODE FOR CARRYING OUT THE INVENTION

Figure 1:
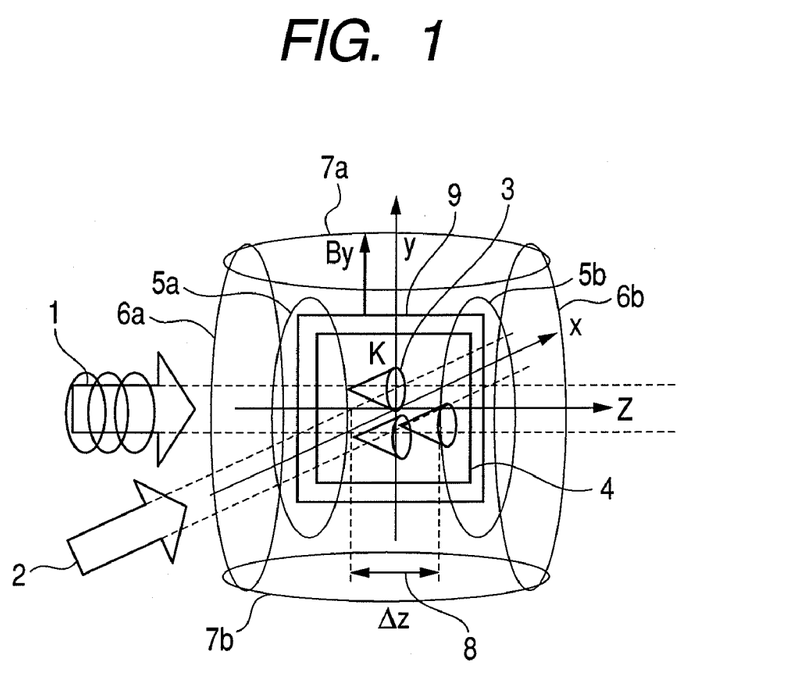
FIG. 1 is a schematic illustration of an atomic magnetometer according to the present invention.

It is known that the central frequency $f_0$ of a resonance type atomic magnetometer can be expressed as $f_0 = g\mu B_a/(Qh)$ when the bias magnetic field applied to the z-axis of FIG. 1 is $B_a[T]$.

The inventors of the present invention have paid intensive efforts in order to broaden the measurement frequency band to come to recognize for the first time that $df_0 = g\mu dB_a/(Qh)$ is obtained as a result of total differentiation of the above equation and hence the measurement frequency band can be broadened by producing a magnetic field gradient having a difference of magnetic field intensity of $dB_a$.

As a result, the inventors achieved the present invention represented by the embodiments described below. Now, a magnetic sensing method, an atomic magnetometer and a magnetic resonance imaging apparatus according to the present invention will be described below separately.

First Embodiment

Magnetic Sensing Method

This embodiment of magnetic sensing method of the present invention has the following characteristics.

Specifically, a pump light having a circularly polarized component and a probe light having a linearly polarized component are irradiated onto a group of atoms (a mass of atoms) contained in a cell so as to make the lights produce an intersection region (or an intersection width). Then, a magnetic sensing operation is conducted by utilizing a change of rotation angle of a plane of polarization of the probe light before and after it passes the cell (which may also be expressed as a change in the angle of rotation in the direction of polarization). The pump light and the probe light are irradiated in a state where a magnetic field of the direction in which the pump light strikes the intersection region is provided with a gradient to acquire information relating to the change of rotation angle of the plane of polarization of the probe light before and after passing the cell.

A: Cell

The cell is formed by using a material that can transmit the probe light and the pump light such as glass or plastic. Alkali metal (K or Rb) in the form of gas is contained in the cell as the group of atoms. The alkali metal does not need to be in a gaseous state (vapor) when any sensing operation is not conducted so long as it is turned into a gaseous state at the time of sensing operation. For example, potassium metal may be put into a glass cell and heated to about 180° C. in order to fill the inside of the cell with potassium metal vapor.

The group of atoms contained in the cell is not limited to atoms of alkali metal. Any atoms may be employed for the purpose of the present invention so long as they can be used for the above described sensing method. Besides, gas that operates as buffer may also be contained in the cell in addition to the group of atoms. Furthermore, atoms of Xe or others that can operate for spin exchange with K or Rb may also be contained in the cell in addition to the group of atoms.

B: Pump Light

While it is desirable that the pump light is intrinsically a circularly polarized light, or substantially includes a circularly polarized light only, it may include one or more than one other polarized components so long as it includes a circularly polarized component for the purpose of the present invention.

The pump light is employed to make the spinning directions of unpaired electrons of the atoms in the group of atoms agree with each other. More specifically, the spinning directions of atoms can be aligned by means of a phenomenon referred to as pumping of the circularly polarized light. The random spinning directions of atoms can be aligned with the proceeding direction of the pump light by means of clockwise polarized pump light. The spinning directions of atoms can be aligned with the direction opposite to the proceeding direction of the pump light by means of counterclockwise polarized pump light.

The spinning directions of atoms can be aligned because the circularly polarized light has an angular momentum and hence there exist spinning directions that do not absorb light due to the law of conservation of angular momentum. Once atoms are excited, they emit light in a randomly polarized state by spontaneous emission and can take fundamental states that are different from each other. However, as pumping is repeated, the spinning direction of the atoms of the group of atoms can be aligned ultimately.

C: Probe Light

The probe light is desirably spaced from the resonance frequency of the atoms in order to avoid unnecessary pumping. Additionally, while it is desirable that the probe light is linearly polarized light, or substantially includes linearly polarized light, it may include one or more than one other polarized components so long as it includes a linearly polarized component for the purpose of the present invention.

Then, the probe light and the pump light are irradiated so as to make them intersect each other and produce an intersection region. Generally, the probe light and the pump light are irradiated so as to make them intersect orthogonally although no particular limitations are provided for the purpose of the present invention so long as they intersect each other.

It is known that, as the linearly polarized light is made to strike a polarized atom group, the plane of polarization rotates due to an effect referred to as paramagnetic Faraday rotation. More specifically, the probe light proceeding along the incident direction is subjected to torque due to the measurement magnetic field (the magnetic field component orthogonal to both the pump light (x-direction) and the probe light (z-direction) and rotates in the xz-plane and the rotation angle is proportional to the magnitude of spin of the group of atoms.

According to the invention relating to this embodiment, a group of polarized atoms is formed by means of the pump light and the linearly polarized probe light is made to strike the group of atoms in the cell to acquire information on the rotation angle of the plane of polarization of the probe light before and after it passes the cell. For example, the rotation angle of the plane of polarization of the probe light is measured.

As for a light source, separate light sources may be used respectively for the pump light and the probe light. Alternatively, a common light source may be used and the circularly polarized pump light and the linearly polarized probe light may be produced by means of a polarizing plate. One or two lasers may be used as a light source or sources for outputting the pump light and the probe light. For example, lasers of a wavelength of about 770 nm that are spaced from each other by a range between 0.02 nm and 1 nm may be used when potassium is employed for the group of atoms in the cell.

D: Acquisition of Information Relating to Rotation Angle of Plane of Polarization of Probe Light Information relating to the plane of polarization (or the direction of polarization) can be acquired typically by detecting the probe light after passing the cell by means of a row of photodiodes by way of a polarizing plate. Of course, a technique other than the above-described one using the above-described detection of a row of photodiodes may alternatively be used so long as it can acquire information relating to the rotation angle of the plane of polarization.

E: Application of Magnetic Field Having Gradient

According to the invention relating to this embodiment, the pump light and the probe light are irradiated in a state where the magnetic field of the direction in which the pump light strikes the intersection region is provided with a gradient. As a result of utilizing a magnetic field gradient in this way, the central frequency $f_0$ of the resonance type atomic magnetometer itself can be provided with a gradient to consequently broaden the measurement frequency band.

In other words, the following arrangement is desirable according to the invention relating to this embodiment. The magnetic field of the direction in which the pump light strikes the intersection region is provided with such a gradient that the measurement frequency band is broadened if compared with an instance where it is not provided with any gradient. For example, the magnetic field of the direction in which the pump light strikes the intersection region is provided with such a gradient that the measurement frequency band is broadened by not less than twice, desirably by not less than ten times, if compared with an instance where it is not provided with any gradient.

A gradient magnetic field is employed for a magnetic resonance imaging apparatus in order to encode positional information. Different from such a gradient magnetic field, the magnetic field of the direction in which the pump light strikes the intersection region is selectively provided with a gradient at the cell or at the intersection region. In short, a magnetic field provided with a gradient according to the present invention differs from the gradient magnetic field of a magnetic resonance imaging apparatus. More specifically, for the purpose of this embodiment, the magnetic field of the direction in which the pump light strikes the intersection region (z-direction) is provided with a gradient. The direction in which such a gradient is provided is not subjected to any particular limitations.

In other words, the magnetic field gradient with which the magnetic field of the direction in which the pump light strikes the intersection region is provided may be a magnetic field gradient in the direction in which the pump light strikes the intersection region or one in the direction in which the probe light strikes the intersection region. Still alternatively, it may be a magnetic field gradient in the direction perpendicular to both the direction in which the pump light strikes the intersection region and the direction in which the probe light strikes the intersection region.

Particularly, when the magnetic field of the direction in which the pump light strikes the intersection region (z-direction) (which may also be referred to as bias magnetic field) is provided with a gradient in the z-direction, the gradient clearly differs from the gradient magnetic field of an MRI apparatus because the direction in which a gradient magnetic field is applied in an MRI apparatus is the y-direction that is the magnetic field direction for measurement. Of course, the scope of the present invention includes an instance where a cell is provided with a magnetic field gradient for the gradient magnetic field of an MRI apparatus or for some other reason so that the cell is provided with a magnetic field gradient as a result and hence the measurement frequency band is broadened if compared with an arrangement where no such gradient is provided. There can be at least three arrangements and combinations thereof for the gradient with which the magnetic field of the direction in which the pump light strikes the intersection region is provided. The first arrangement is that a magnetic field gradient is provided in the direction in which the pump light strikes the intersection region. The second arrangement is that a magnetic field gradient is provided in the direction in which the probe light strikes the intersection region. The third arrangement is that a magnetic field gradient is provided in the direction perpendicular to both the direction in which the pump light strikes the intersection region and the direction in which the probe light strikes the intersection region.

It is desirable that the magnetic field having a gradient in the direction in which the pump light strikes the intersection region is not applied to the object of examination.

When h is the Planck's constant, g is a g-factor, R is a pumping rate, $R_{SD}$ is a spin decay rate and $\mu$ is the Bohr magneton. In order for the magnetic field to be applied to broaden the measurement frequency band, it is desirable that a magnetic field gradient having a magnetic field intensity difference of not less than $4h(R_{SD}+R)/(g\mu)$ is applied to the intersection.

The gradient with which the magnetic field of the direction in which the pump light strikes the intersection region may be a linear magnetic field gradient, a stepped magnetic field gradient or a curved magnetic field gradient.

Application of a magnetic field having a gradient can be realized by utilizing a reverse Helmholtz coil. Details thereof will be described in greater detail in Examples below.

As described above, alkali metal atoms are contained in a cell as the group of atoms and the pump light in a circularly polarized state and the probe light in a linearly polarized state are made to strike the cell so as to be orthogonal relative to each other at the intersection region. The magnetic sensing method can be realized by measuring the magnetic component in a direction orthogonal to both the pump light and the probe light that is attributable to the object of examination as the rotation angle of the plane of polarization of the probe light.

Second Embodiment

Atomic Magnetometer

The atomic magnetometer of this embodiment is formed so as to include a cell, a group of atoms contained in the cell, a light source for outputting a pump light having a circularly polarized component and a light source for outputting a probe light having a linearly polarized component.

The atomic magnetometer has a magnetic field application unit for applying a magnetic field gradient having a magnetic field intensity difference of not less than $4h(R_{SD}+R)/(g\mu)$ to an intersection region of the pump light and the probe light, where h is the Planck's constant, g is a g-factor, R is a pumping rate, $R_{SD}$ is a spin decay rate and $\mu$ is the Bohr magneton.

The atomic magnetometer of this embodiment may further include a rotation angle measurement unit that irradiates the pump light and the probe light onto the group of atoms contained in the cell so as to make them produce an intersection region and measures a change of rotation angle of a plane of polarization of the probe light before and after passing the cell.

As for the magnetic field gradient, a magnetic field of the direction in which the pump light strikes the intersection region can be provided with a gradient. Particularly, it is desirable that a magnetic field gradient is provided over the intersection.

Alkali metal vapor may be used for the group of atoms.

When at a magnetic field gradient having a magnetic field intensity difference of not less than $4h(R_{SD}+R)/(g\mu)$ (tesla) is employed, the measurement region of the atomic magnetometer can be broadened by twice. Details thereof will be described in greater detail in Examples below.

Any of the technical features described above for the invention of the first embodiment can be applied to the atomic magnetometer of this embodiment so long as it is not particularly contradictory to this embodiment.

Third Embodiment

Magnetic Resonance Imaging Apparatus

The magnetic resonance imaging apparatus of this embodiment comprises the following components.

Specifically, it has an atomic magnetometer adapted to use the magnetic sensing method according to the present invention as described above by referring to the first embodiment of the present invention. It additionally has a gradient magnetic field generating coil for providing a gradient magnetic field different from the magnetic field for providing the intersection region with a magnetic field gradient and a magnetostatic field generating coil. It further includes an RF coil for irradiating an electromagnetic wave to the object of examination.

Any of the components of an ordinary magnetic resonance imaging apparatus may appropriately be used for this embodiment except that a resonance type atomic magnetometer as described above is employed as detection apparatus (receiving sensor) for receiving RF signals.

A gradient magnetic field generating coil is employed typically for the purpose of encoding spatial positional information on protons. Three coils may be provided respectively in the directions of the three axes (x-axis, y-axis, z-axis).

An RF coil is employed for the purpose of irradiating an RF pulse.

If necessary, the magnetic resonance imaging apparatus can be made to include a bed, a shield and other components. When an atomic magnetometer as described above is employed, it is optimally operated with a background magnetic field that is reduced by a magnetic shield to a level sufficiently lower than 100 nT because the lower the background magnetic field, the better.

The magnetic resonance imaging apparatus of this embodiment further includes a unit for applying a magnetic field with a magnetic flux density $B_0$ in the direction same as the direction of pump light. It is desirable that a magnetic field gradient having a magnetic field intensity difference of about $(N/256)\times213,000\ B_0Qh/(g\mu)[T]$ is applied over the intersection region. In the above expression, N is the number of pixels subjected to frequency encoding (e.g., 128, 256, 512 or 1024) and Q is the slowdown factor. The reason why the use of a magnetic field intensity difference of about $(N/256)\times213,000\ B_0Qh/(g\mu)[T]$ is desirable is described in the following examples.

Any of the technical features described above for the invention of the first embodiment and that of the second embodiment can be applied to the magnetic resonance imaging apparatus of this embodiment so long as it is not particularly contradictory to this embodiment.

EXAMPLES

Example 1

Atomic Magnetometer

FIG. 1 is a schematic illustration of an atomic magnetometer according to the present invention, illustrating the characteristics of Example 1.

Referring to FIG. 1, a circularly polarized laser beam 1 is emitted from a light source for circular polarization and a laser beam 2 emitted from a light source for a probe that becomes linearly polarized probe light, while numeral 3 denotes alkali metal vapor designating a precession of spinning electrons as schematically illustrated and numeral 4 denotes a sealed cell containing alkali metal vapor. In FIG. 1, reverse Helmholtz coils 5a and 5b are units for applying a magnetic field gradient to the cell and normal Helmholtz coils 6a, 6b, 7a and 7b apply a substantially uniform bias magnetic field in the cell 4, which are tri-axial normal Helmholtz coils in the axial directions of x, y and z, although the normal Helmholtz coils in the direction of the x-axis are omitted. In FIG. 1, numeral 8 denotes an intersection width $\Delta z$ of the intersection of the circularly polarized light 1 and the probe light 2 in the z direction and numeral 9 denotes a temperature-controlled bath for maintaining the temperature of the alkali metal cell 4 to a constant level.

In this example, a magnetic field gradient having a bias difference of not less than $4h(R_{SD}+R)/(g\mu)$ is applied over the width $\Delta z$ of the intersection of the circularly polarized light 1 and the probe light 2 by the units 5a and 5b for applying a magnetic field gradient to the cell 4.

Thus, a resonance type atomic magnetometer that has a wide measurement band and includes an atomic magnetometer having the above-described features is provided.

In the following description, Q is a slowdown factor, h is the Planck's constant ($=6.6256\times10^{-27}$ Js), g is a g-factor (up to 2), $\mu$ is the Bohr magneton ($=9.2732\times10^{-24}$ A m$^2$). R is a pumping rate and $R_{SD}$ is a spin decay rate.

In this example, potassium (atomic symbol: K) is employed as alkali metal and held to a state of saturated vapor by maintaining the temperature of the temperature-controlled bath 9 to 190° C., while a circularly polarized laser beam 1 is irradiated onto the alkali metal vapor. The polarization P of the alkali metal vapor is made substantially equal to 1 by exciting the vapor by means of the circularly polarized light. Then, the slowdown factor Q becomes substantially equal to 4.

I. M. Savukov, S. J. Seltzer, M. V. Romalis and K. L. Sauer, Phys. Rev. Lett. 95, 063004 (2005) describes about decay time. More specifically, the lateral decay time $T_{2a}$ of an atomic magnetometer is expressed by $$1/T_{2a} = R/4 + GR_{SE}R_{SD}/R \qquad (1),$$

where $R_{SD}$ is a spin exchange rate and G is regarded substantially as constant, which is about ⅕.

From the equation (1), $T_{2a}$ takes a maximum value of $T_{2a}^{max}=(R_{SE}R_{SD}/5)^{-0.5}$ and the sensitivity of the atomic magnetometer is optimized when $T_{2a}$ is $R=2(GR_{SE}R_{SD})^{0.5}$. More specifically, if $R_{SE}=105$ kHz and $R_{SD}=55$ kHz, a maximum value of $T_{2a}^{max}=0.93$ sec is obtained to optimize the sensitivity of the atomic magnetometer when R=2,150 Hz.

Now, the measurement band $BW^{atomic\ magnetometer}$ of a resonance type atomic magnetometer is normally expressed by $$BW^{atomic\ magnetometer}=2(R_{SD}+R)/Q \qquad (2)$$

which takes a value of about 1 kHz when the sensitivity is optimized.

On the other hand, when the bias magnetic field applied to the direction of the z-axis in FIG. 1 is $B_a[T]$, the central frequency $f_0$ of a resonance type atomic magnetometer is normally expressed by $$f_0=g\mu B_a/(Qh) \qquad (3).$$

Then, the following equation is obtained as total differential of the equation (3).

$$df_0=g\mu B_a/(Qh) \qquad (4)$$

Thus, a measurement band of $df_0=g\mu dB_a/(Qh)$ is obtained by producing a magnetic field gradient having a magnetic field intensity difference of $dBa[T]$.

Therefore, from the equations (2) and (4) the measurement band of an atomic magnetometer can be broadened to not less than twice of the measurement band of a conventional atomic magnetometer by producing a magnetic field gradient having a magnetic field intensity difference of $$dBa=4h(R_{SD}+R)/(g\mu)[T].$$

More specifically, a value of dBa that is not less than 0.286 μT provides an effect of broadening the measurement band that is conventionally about 1 kHz to not less than 2 KHz. As pointed out above, the direction of the magnetic field that is the object to which a magnetic field gradient is provided is the direction in which the pump light strikes the intersection region. However, any direction may be used as the direction in which a magnetic field gradient is provided or formed as described below. When the bias magnetic field is Bz and $\delta Bz/\delta x$, $\delta Bz/\delta y$ or $\delta Bz/\delta z$ is considered, it is only necessary to provide a gradient at least in one of the three directions.

Figure 2A:
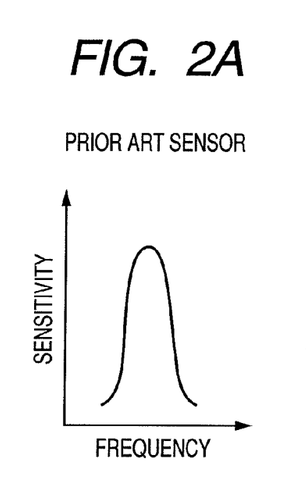
FIGS. 2A and 2B are schematic illustrations for explaining broadening of the measurement frequency band according to the present invention.
Figure 2B:
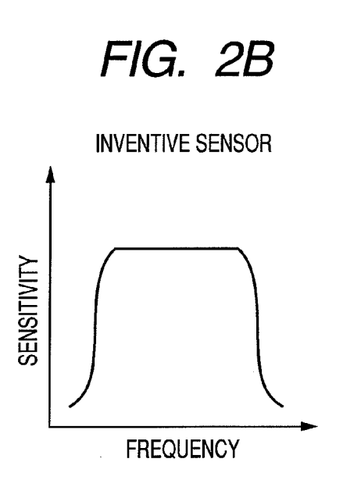

FIGS. 2A and 2B schematically illustrate that a conventional atomic magnetometer having a narrow sensing band of as illustrated in FIG. 2A is converted to an atomic magnetometer having a broad sensing band as illustrated in FIG. 2B by means of the present invention of providing the cell with a magnetic field gradient.

Referring to FIG. 1, if the distance between the centers, the radius and the number of windings of the normal Holmheltz coils 6a and 6b are 2b, a and N respectively while the electric current is I and the magnetic permeability of vacuum is $\mu_0 I$, the magnetic flux density in the direction of the z-axis is expressed by $$B_a(z)=0.5\mu_0 Ia^2((a^2+(b-z)^2)^{1.5}+(a^2+(b+z)^2)^{1.5}).$$

A substantially uniform magnetic field can be obtained at a central part by realizing b:a=1:2. For instance, if a=20 cm, b=10 cm, N=100 and I=0.1 A, a substantially uniform magnetic field of 45 μT can be obtained at a central part. Then, the earth magnetism can be cancelled and the central frequency of the Larmor frequency of the atomic magnetometer can be adjusted by finely adjusting the electric current.

Referring back to FIG. 1, if the distance between the centers, the radius and the number of windings of the reverse Helmholtz coils 5a and 5b are 2b, a and N respectively while the electric current is I and the magnetic permeability of vacuum is $\mu_0 I$, the magnetic flux density in the direction of the z-axis is expressed by $$B_a(z)=0.5\mu_0 Ia^2((a^2+(b-z)^2)^{1.5}+(a^2+(b+z)^2)^{1.5})$$

so that a necessary magnetic field gradient can be formed.

More specifically, if a=15 cm, b=7.5 cm, N=1 and I=0.1 A, a magnetic field gradient of 0.0481 μT/cm can be obtained at a central part. Then, the frequency band can be adjusted to a desired range by finely adjusting the electric current. Particularly, a magnetic field intensity difference dBa of not less than 0.286 μT can be obtained when Δz=5.9 cm and I=0.1 A.

Example 2

Magnetic Resonance Imaging Apparatus

Figure 3:
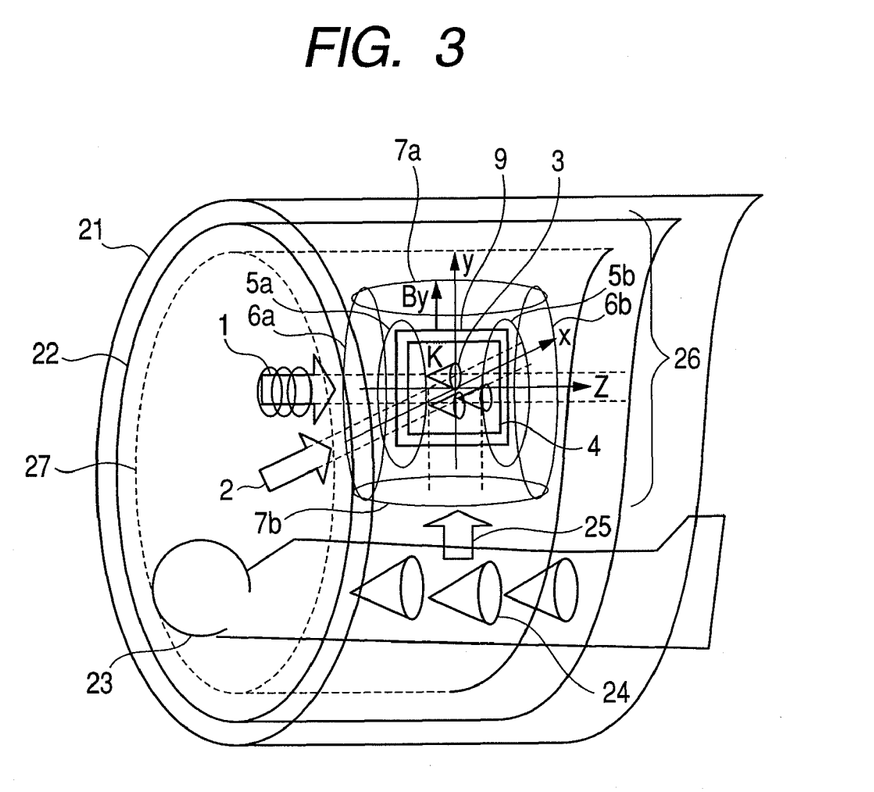
FIG. 3 is a schematic illustration of a magnetic resonance imaging apparatus according to the present invention.

FIG. 3 is a schematic illustration of Example 2 of the present invention.

In FIG. 3, a $B_0$ (electric) magnet 21 for MRI and a gradient coil 22 that can be applied to a magnetic field gradient (gradient magnetic field) in the x, y and z directions are schematically illustrated, while an RF coil unit section 27 for transmitting a radio frequency wave (RF wave) and a human body 23 and the precession 24 of the nuclear spin of protons in the human body are schematically illustrated. In FIG. 3, numeral 25 denotes an MRI signal from protons and numeral 26 denotes an atomic magnetometer substantially same as the one described above by referring to Example 1.

With this example, an RF wave is irradiated onto the human body by means of the RF coil unit 27 in a state where a magnetic field of $B_0[T]$ is applied in the direction of the z-axis by means of the $B_0$ electric magnet 21. Then, the nuclear spin 24 of protons is made to fall into the xy-plane and the MRI signal (an FID signal or a spin echo signal) that is produced when the spin is decayed to restore the original state is received by the atomic magnetometer that is provided with a magnetic field gradient, which thus operates as RF receiving sensor, in the MRI apparatus.

A gradient coil 22 is employed as in the case of conventional MRI imaging and the frequency and the z-axis coordinate position and the phase and the (x, y)-axes coordinate positions are associated with each other for the MRI signal by means of frequency encoding operation and phase encoding operation. A real image can be formed by way of a Fourier transform process after acquiring k-space data.

Particularly, a cell 4 having a magnetic field gradient that has a magnetic field intensity difference of not less than $4h(R_{SD}+R)/(g\mu)$, desirably about 213,000 $B_0 Qh/(g\mu)[T]$, is employed for the atomic magnetometer 26 of this example. Then, as a result, a band characteristic desirable for imaging with $B_0$ magnet is obtained.

Thus, the magnetic resonance imaging apparatus of this example has a $B_0$ magnet 21 with a magnetic flux density $B_0$, alkali metal vapor 3, a sealed cell 4 containing the alkali metal vapor and units 5a and 5b for applying a magnetic field gradient to the cell 4. Q is a slowdown factor, h is the Planck's constant, g is a g-factor, R is a pumping rate, $R_{SD}$ is a spin decay rate and μ is the Bohr magneton.

Then, the atomic magnetometer 26 provided with a magnetic field gradient having a magnetic field intensity difference of not less than $4h(R_{SD}+R)/(g\mu)$ over the intersection volume of the circularly polarized light 1 and the probe light 2 is operated as receiving sensor. Desirably, an atomic magnetometer 26 to which a magnetic field gradient having a magnetic field intensity difference of about 213,000 $B_0 Qh/(g\mu)[T]$ is operated as receiving sensor. An MRI apparatus having such a receiving sensor can excellently operate for image formation, utilizing the above-described frequency band. Note that the expression of 'about' 213,000 $B_0 Qh/(g\mu)$ [T] may include a difference of not more than 20%, preferably a difference of not more than 10%, more preferably a difference of not more than 5%. Most preferably the magnetic field gradient is made to have a difference of not more than 2% relative to 213,000 $B_0Qh/(g\mu)$[T].

This example will be described further in detail below.

Normally, a measurement band of about 32 kHz is desirably employed for an MRI apparatus with a $B_0$ magnetic field of about 1.5 T for the purpose of MRI imaging with a number of pixels of about 256.

The differences of frequency shifts of protons in water and those in aliphatics increase proportionally relative to $B_0$. Therefore, a band of about $BW^{MRI}$=213,000 $B_0$[Hz] (6) is desirable for a $B_0$ magnet of $B_0$[T] in order to prevent image disturbances due to differences of frequency shifts of protons (chemical shift artifacts) from taking place.

Thus, from the equations (4) and (6), the measurement band of a conventional atomic magnetometer can be broadened to about $BW^{MRI}$=213,000 $B_0$[Hz] that is desirable for MRI by forming a magnetic field gradient having a magnetic field intensity difference of about $dB_a$=213,000 $B_0Qh/(g\mu)$ [T] (7).

More specifically, the measurement band that is conventionally about 1 kHz can be broadened to about 32 kHz when $dB_a$ is made equal to about 4.57 μT for an atomic magnetometer that can desirably be used in an MRI apparatus of $B_0$=1.5 T. The above-described idea can be generalized by the formula below, where N (natural number) is the number of pixels subjected to frequency encoding and Q is a slowdown factor. In other words, about $(N/256) \times 213{,}000\ B_0Qh/(g\mu)$[T] is used over the intersection region. N may be 256 or may alternatively appropriately be selected from 128, 512, 1024 and 2048.

Additionally, $dB_a$ is made equal to 0.304 μT, 0.608 μT or 1.52 μT for the atomic magnetometer that is desirably used for an MRI apparatus of $B_0$=0.1 T, 0.2 T or 0.5 T respectively. With this arrangement, the measurement band of a conventional atomic magnetometer that is optimized to about 1 kHz can be broadened to 2.13 kHz, 4.26 kHz or 10.65 kHz respectively.

Furthermore, the problem of degraded image of an MRI apparatus having an atomic magnetometer with $B_0$=0.1 or more where the band problem is particularly remarkable can be suppressed by using a magnetic field gradient having a magnetic field intensity difference of not less than $$dB_a = 4h(R_{SD}+R)/(g\mu)\ [\text{T}] \quad (8).$$

Example 3

Magnetic Resonance Imaging Method

Figure 4:
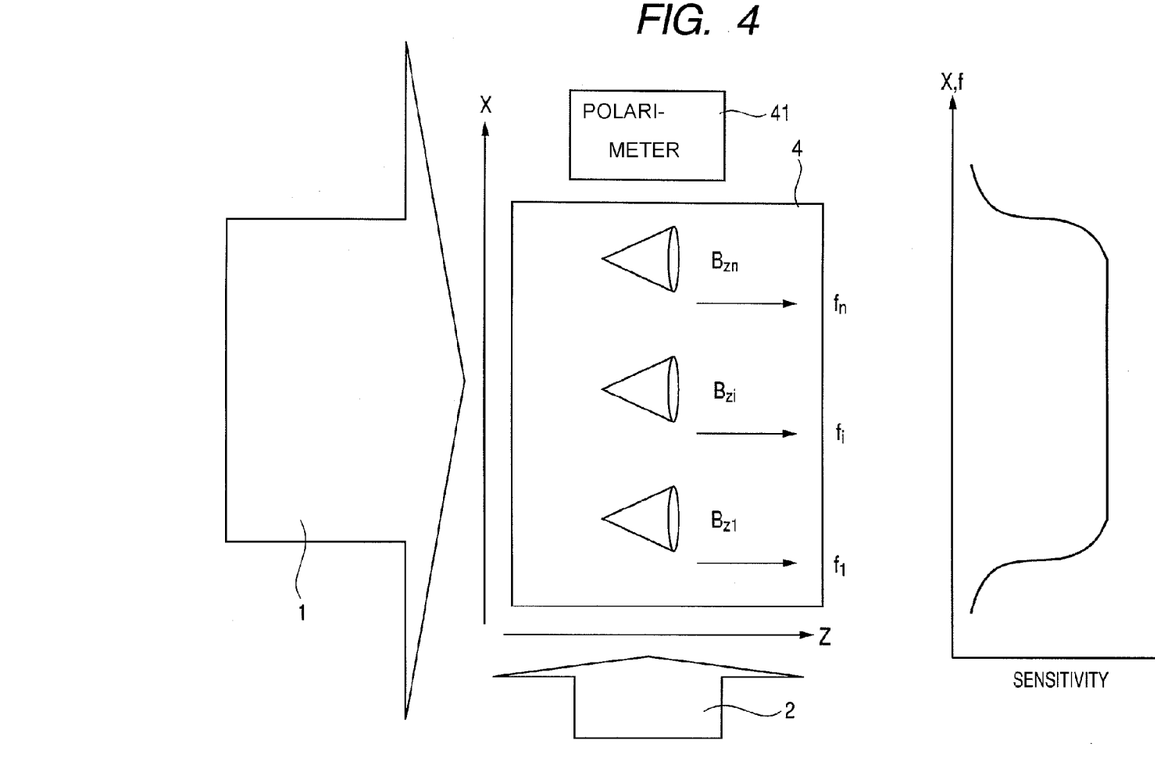
FIG. 4 is a schematic illustration of a polarimeter for explaining a magnetic resonance imaging method of the present invention.

FIG. 4 schematically illustrates Example 3 of the present invention where a polarimeter 41 comprises a beam splitter and a photoelectric sensor in combination. The method of Example 3 is essentially the same as the method of Example 1 except that a magnetic sensing position is identified as corresponding to a frequency based on the gradient with which the magnetic field of the direction in which the pump light strikes the intersection region is provided.

As seen in FIG. 4, magnetic fields $B_{z,x1}, \ldots, B_{z,xi}, \ldots, B_{z,xn}$ are formed corresponding to the respective positions of the x direction by a magnetic field gradient Bz. Those magnetic fields are detected at different resonance frequencies $f_{x1}, \ldots, f_{xi}, \ldots, f_{xn}$ depending on the respective magnetic field intensities. Thus, the respective magnetic sensing positions are identified as corresponding to the frequencies, which is advantageous because positional encoding of one dimension on a sensor can be effected without increasing the number of sensors.

Figure 5:
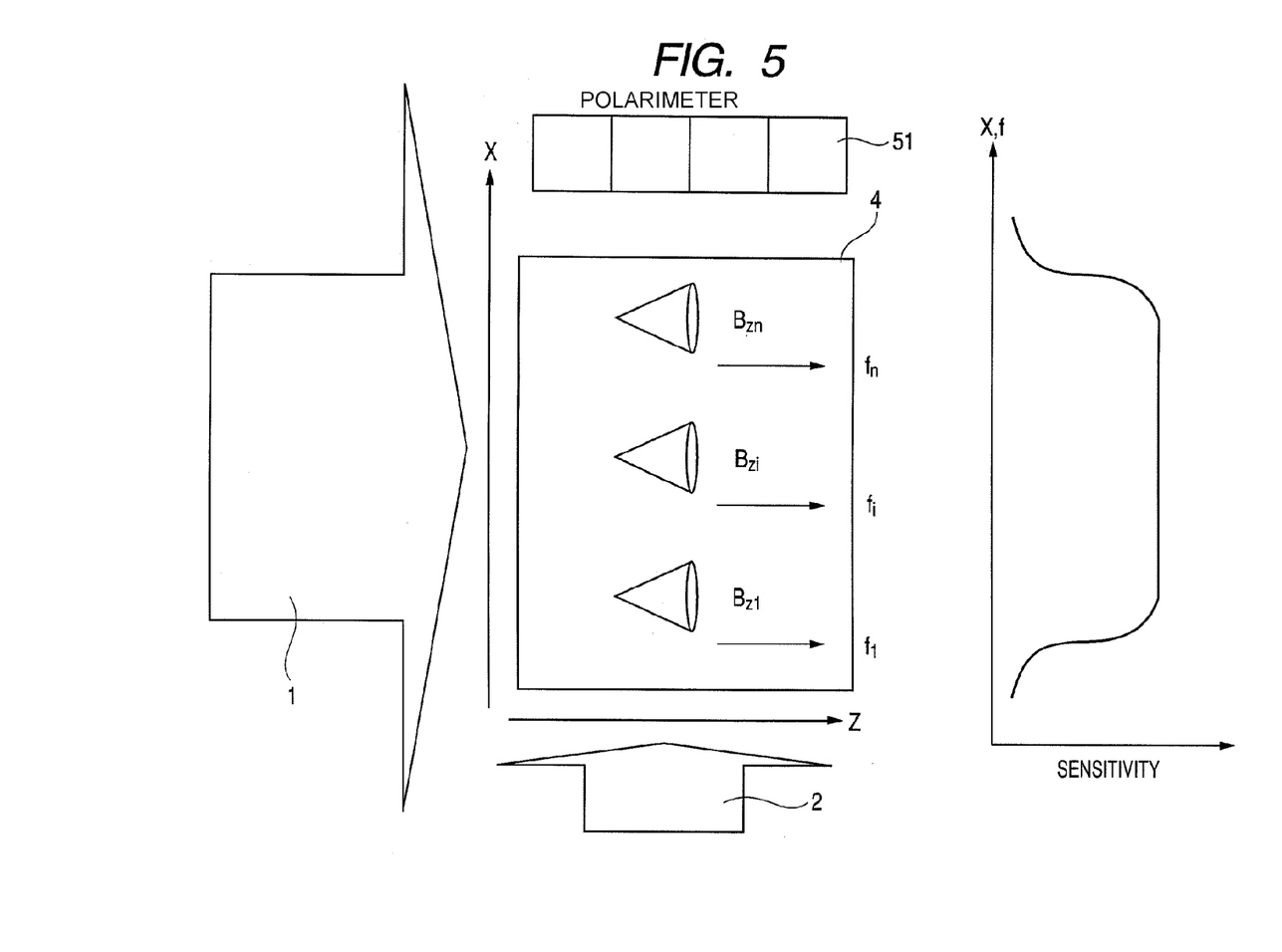
FIG. 5 is a schematic illustration of an atomic magnetometer for explaining two-dimensional identification of magnetic sensing positions.

On the other hand, FIG. 5 illustrates an exemplary atomic magnetometer with a gradient which is capable of identifying two-dimensional positions in the x-z plane. In FIG. 5, numeral 51 represents a one-dimensional polarimeter arranged in the z-direction. Thus, in the present invention, it is possible to simultaneously measure magnetic information at two-dimensional positions with high sensitivity.

INDUSTRIAL APPLICABILITY

An atomic magnetometer described above can be used for a magnetic resonance imaging apparatus to acquire three-dimensional information on living bodies.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2007-149156, filed on Jun. 5, 2007 which is hereby incorporated by reference herein in its entirety.

The invention claimed is:

1. A magnetic sensing method comprising:
   irradiating a pump light having a circularly polarized component and a probe light having a linearly polarized component onto a group of atoms contained in a cell so as to make the lights produce an intersection region; and
   detecting a change of rotation angle of a plane of polarization of the probe light before and after passing the cell,
   wherein the pump light and the probe light are irradiated in a state where a magnetic field of the direction in which the pump light strikes the intersection region is provided with a gradient to acquire information relating to the change of rotation angle of the plane of polarization of the probe light before and after passing the cell.

2. The magnetic sensing method according to claim 1, wherein the gradient with which the magnetic field of the direction in which the pump light strikes the intersection region is provided is so provided as to broaden a measurement frequency band if compared with an instance where the gradient is not provided.

3. The magnetic sensing method according to claim 2, wherein the gradient with which the magnetic field of the direction in which the pump light strikes the intersection region is provided is so provided as to broaden the measurement frequency band by not less than twice if compared with an instance where the gradient is not provided.

4. The magnetic sensing method according to claim 1, wherein the gradient with which the magnetic field of the direction in which the pump light strikes the intersection region is provided is selectively provided to the cell or the intersection region.

5. The magnetic sensing method according to claim 1, wherein the gradient with which the magnetic field of the direction in which the pump light strikes the intersection region is provided is:
   a magnetic field gradient along the direction in which the pump light strikes the intersection region;
   a magnetic field gradient along the direction in which the probe light strikes the intersection region; or
   a magnetic field gradient along the direction orthogonal to both the direction in which the pump light strikes the intersection region and the direction in which the probe light strikes the intersection region.

6. The magnetic sensing method according to claim 1, wherein a magnetic field gradient having a magnetic field intensity difference of not less than $4h(R_{SD}+R)/(g\mu)$ is applied to the intersection region, where h is Planck's constant;

g is a g-factor;

R is a pumping rate;

$R_{SD}$ is a spin decay rate; and $\mu$ is a Bohr magneton.

7. The magnetic sensing method according to claim 1, wherein the gradient with which the magnetic field of the direction in which the pump light strikes the intersection region is provided is a linear magnetic field gradient, a stepped magnetic field gradient or a curved magnetic field gradient.

8. The magnetic sensing method according to claim 1, wherein alkali metal atoms are contained in the cell as the group of atoms and the pump light in a circularly polarized state and the probe light in a linearly polarized state are orthogonal relative to each other in the intersection region so that a magnetic component based on an object of examination in the direction orthogonal relative to both the pump light and the probe light is measured as the change of rotation angle of the plane of polarization of the probe light.

9. A magnetic resonance imaging apparatus comprising:

an atomic magnetometer irradiating a pump light having a circularly polarized component and a probe light having a linearly polarized component onto a group of atoms contained in a cell so as to make the lights produce an intersection region, and for detecting a change of rotation angle of a plane of polarization of the probe light before and after passing the cell, wherein the pump light and the probe light are irradiated in a state where a magnetic field of the direction in which the pump light strikes the intersection region is provided with a gradient to acquire information relating to the change of rotation angle of the plane of polarization of the probe light before and after passing the cell;

a gradient magnetic field generating coil for providing the intersection region with a gradient magnetic field different from the magnetic field of the direction in which the pump light strikes the intersection region which is to be provided with a gradient;

a magnetostatic field generating coil; and an RF coil for irradiating an electromagnetic wave onto an object of inspection.

10. An atomic magnetometer comprising:

a cell;

a group of atoms contained in the cell;

a light source for outputting a pump light having a circularly polarized component; and a light source for outputting a probe light having a linearly polarized component, the atomic magnetometer further comprising a magnetic field application unit for applying a magnetic field gradient having a magnetic field intensity difference of not less than $4h(R_{SD}+R)/(g\mu)$ to an intersection region of the pump light and the probe light, where h is Planck's constant;

g is a g-factor;

R is a pumping rate;

$R_{SD}$ is a spin decay rate; and $\mu$ is a Bohr magneton.

11. The atomic magnetometer according to claim 10, further comprising a rotation angle measurement unit for irradiating the pump light and the probe light onto the group of atoms contained in the cell so as to produce the intersection region and measuring a change of rotation angle of a plane of polarization of the probe light before and after passing the cell.

12. The atomic magnetometer according to claim 10, wherein the magnetic field gradient is applied to a magnetic field of the direction in which the pump light strikes the intersection region is provided.

13. The atomic magnetometer according to claim 10, wherein the magnetic field gradient has a gradient over the intersection region.

14. The atomic magnetometer according to claim 10, wherein alkali metal vapor is employed as the group of atoms.

15. An atomic magnetometer according to claim 10, wherein the atomic magnetometer is incorporated in a magnetic resonance imaging apparatus as a receiving sensor.

16. The magnetic resonance imaging apparatus according to claim 15, further comprising a unit for applying a magnetic field having a magnetic flux density $B_0$ in the same direction as the direction of the pump light such that a magnetic field gradient having a magnetic field intensity difference of about $(N/256) \times 213,000\, B_0 Qh/(g\mu)$ [T] is applied to the atomic magnetometer over the intersection region, where:

N is a natural number representing the number of pixels subjected to frequency encoding; and Q is a slowdown factor.

17. The magnetic sensing method according to claim 1, wherein a magnetic sensing position in the cell is identified as corresponding to a frequency based on the gradient with which the magnetic field of the direction in which the pump light strikes the intersection region is provided.

* * * * *